May 5, 1970 B. F. GRIB 3,510,794

MULTIPLE TUNING FORK RESONATOR FILTER WITH FEEDBACK

Filed March 21, 1968 2 Sheets-Sheet 1

INVENTOR
BORIS F. GRIB
BY Darby & Darby
ATTORNEYS

INVENTOR
BORIS F. GRIB
BY Darby & Darby
ATTORNEYS

United States Patent Office 3,510,794

Patented May 5, 1970

3,510,794

MULTIPLE TUNING FORK RESONATOR FILTER WITH FEEDBACK

Boris F. Grib, Huntington, N.Y., assignor to Philamon Laboratories Inc., Westbury, N.Y., a corporation of New York Filed Mar. 21, 1968, Ser. No. 714,932
Int. Cl. H03f 3/68
U.S. Cl. 330—126 19 Claims

ABSTRACT OF THE DISCLOSURE

A tuning fork resonator filter is disclosed in which an electrical input signal drives at least two tuning forks having slightly different resonant frequencies, and in which the sum of the output signals from the tuning forks is fed back to the inputs of the tuning forks and the difference of the output signals from the tuning forks provides a filter output signal having a relatively wide passband while retaining the sharp selectivity features of tuning fork resonators.

This invention relates to tuning fork filters, and, more particularly to multiple tuning fork filters employing negative feedback to achieve a relatively wide passband without substantial sacrifice of the sharp selectivity feature inherent in tuning fork resonators.

It is well known to utilize a tuning fork together with electrical driving and electrical pick-up means to form a tuning fork resonator. Such a resonator may be utilized, for example, as a very stable oscillator, or as a highly frequency-selective filter. In either case, the tuning fork resonator is characterized by a very narrow bandwith, typically on the order of 0.02% of the center frequency. This narrow a bandwidth is often too narrow for certain practical filter applications. Therefore, techniques have been employed in the prior art to broaden the bandwith of tuning fork resonators so as to render them more suitable for a greater variety of filter applications.

One technique which has been employed in the prior art is to use two tuning forks having slightly different resonant frequencies. The outputs of the tuning forks are subtracted from each other to produce a frequency response having a greater 3 db bandwidth than a single tuning fork while obtaining improved skirt selectivity characteristics. Such an arrangement is described in U.S. Pat. No. 3,290,609 to Robert R. Shreve. This technique improves upon the skirt selectivity of a single tuning fork resonator, but provides only a moderate broadening of the 3 db filter passband. More specifically, a filter having two tuning forks in combination would have a passband only twice as wide as the passband of a single tuning fork resonator, a filter having four appropriately spaced tuning forks would have a passband four times as wide as a single tuning fork resonator, etc. It is therefore an object of this invention to provide an improved tuning fork filter having a relatively wider bandwidth characteristic.

It is also an object of this invention to provide a multiple tuning fork filter having a greater effective bandwidth per tuning fork than prior art multiple tuning fork filters.

According to the above and other objects, the present invention provides a filter in which an input signal drives at least a pair of tuning forks having slightly different resonant frequencies. The sum of the output signals from the tuning forks is fed back in the negative sense to their inputs, and the difference of the output signals from the tuning forks provides the filter output signal.

An advantage of the present invention is that, in a filter including only two tuning forks having appropriately spaced resonant frequencies, a useful bandwidth of several times the combined bandwidths of the two individual tuning forks can be obtained. Further, the characteristics of the filter response can be adjusted simply by adjusting the gain of a common feedback loop. For example, proper adjustment of the gain of a common feedback loop will produce a Butterworth or "flat-topped" filter response. A slight reduction in the feedback gain will produce a Tchebycheff, or "equal ripple" response. A slight increase in the feedback gain will produce a Gaussian or "non-overshooting" response.

These and other objects and advantages of the present invention will be apparent from the following detailed description and illustrative drawings which set forth the principle of the present invention and, by way of example, the preferred embodiments thereof.

Figure 1:
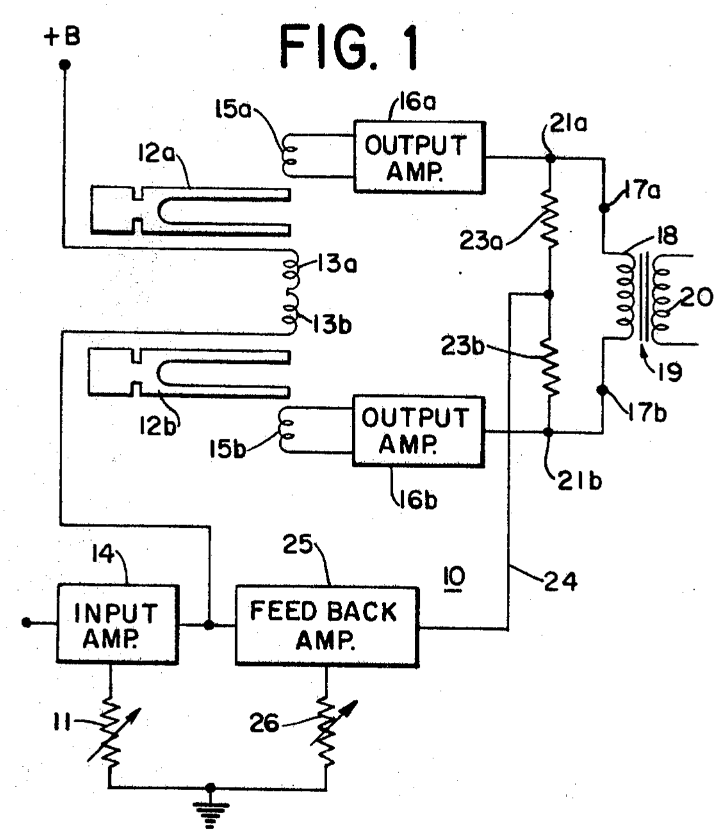
FIG. 1 is a schematic diagram of a dual tuning fork filter according to the present invention.

Referring to FIG. 1 of the drawings, there is shown a block diagram of a dual tuning fork filter 10 according to the present invention. The filter 10 includes a pair of tuning fork resonators **12*a* and 12*v* having slightly different resonant frequencies. The tuning forks 12*a* and 12*b* may be of the type described in U.S. Pat. No. 2,806,-400 to Boris F. Grib and manufactured by Philamon Laboratories, Inc., of Westbury, N.Y. It will be appreciated, however, that other types of tuning forks or vibratory reeds or other vibratory or resonant elements such as crystals may be employed in the filter 10** of the present invention.

The first tuning fork **12*a* is provided with a drive coil 13*a* which may be, and customarily will be, provided with a permanent magnet core in order to provide a bias magnetic field. The bias magnetic field assures that the absolute value of the magnetic field (without regard to polarity) produced by an electrical signal supplied to coil 13*a*** will fluctuate at the same frequency as the electrical signal rather than at twice the frequency of the electrical signal as would be the case if there were no magnetic bias.

The second tuning fork **12*b* is provided with a drive coil 13*b* which is generally of the same construction, number of turns, direction of winding, etc. as the drive coil 13*a* of tuning fork 12*a***.

It is noted that the drive coils **13*a* and 13*b* are connected in series. This arrangement will be desirable in certain circumstances to provide appropriate impedance relations, but it may be desirable in other cases to connect the drive coils 13*a* and 13*b*** in parallel.

It is also noted that, while the tuning fork **12*a* and 12*b* of the filter 10 shown in FIG. 1 are each driven by a single drive coil 13*a* and 13*b*, it may be desirable in some circumstances to provide each of the tuning forks 12*a* and 12*b*** with a pair of drive coils as is described in U.S. Pat. No. 3,290,609 to Robert R. Shreve, or some other driving arrangement.

The tuning fork drive coils 13*a* and 13*b* are, in turn, driven by an input amplifier 14. Input amplifier 14 may be of a conventional type such as, for example, a transistor amplifier having a variable resistor 11 in its base circuit. It will be appreciated, however, that the principles of the present invention do not require the use of an input amplifier in the input circuit, but that, in many instances, amplification will lend increased utility to the filter circuit.

Each of the tuning forks 12*a* and 12*b* is provided with a pick-up coil 15*a* and 15*b* respectively. In each of the pick-up coils 15*a* and 15*b*, there is developed a signal which corresponds in frequency and magnitude to the vibrations of the respective tuning forks 12*a* and 12*b*. While single pick-up coils 15*a* and 15*b* are shown in FIG. 1, it will be appreciated by those skilled in the art that other pick-up arrangements such as, for example, a pair of balanced pick-up coils for each tuning fork may be employed.

Although the principles of the present invention do not require the use of amplifiers in conjunction with the tuning fork resonators, it will be apparent that the tuning fork resonators, operated alone, will have significant transmission losses even for signals at the resonant frequency. Therefore, it will be desirable in many instances to provide sufficient amplification to offset losses and provide a filter with substantially zero loss at the center of the filter passband.

Accordingly, each of the pick-up coils 15*a* and 15*b* feeds into an output amplifier 16*a* and 16*b*, respectively. The output amplifiers 16*a* and 16*b* may be of a conventional type such as, for example, transistor amplifiers.

The output signals from the amplifiers 16*a* and 16*b* are applied via leads 17*a* and 17*b* to the opposite ends of the primary winding 18 of the output transformer 19. This arrangement provides that the output signal coupled over to the secondary winding 20 of transformer 19 will be proportional to the difference between the output signals from the two tuning forks output amplifiers 16*a* and 16*b*. For example, if the signals applied to the ends of primary winding 18 are of the same polarity, the current through primary winding 18, and hence the signal coupled over to secondary winding 20, will be at a minimum. On the other hand, if the signals applied to the ends of winding 18 are of opposite polarity, the current flowing through winding 18, and hence the signal coupled over winding 20 will be at a maximum.

The subtractive relationship between the output signals from the two output amplifiers 16*a* and 16*b* tends to cancel out unwanted signals. For example, signals may be inductively coupled directly from drive coils 13*a* and 13*b* to the pick-up coils 15*a* and 15*b* rather than through the vibratory action of the tuning forks 12*a* and 12*b*. Such unwanted signals would be in phase with each other and would thus tend to cancel each other out in the primary winding 18 of output transformer 19. On the other hand the signals transmitted by the vibratory action of the tuning forks 12*a* and 12*b* would be out of phase by virtue of the different responses of the two tuning forks, and, therefore, these signals would be vectorially combined in the primary winding 18 of output transformer 19. Hence, the subtractive relationship of the output signals from output amplifiers 16*a* and 16*b* caused by the arrangement of output transformer 19 tends to improve the frequency selectivity characteristics of the filter circuit by cancelling-out or rejecting unwanted signals above and below the desired passband.

A pair of resistors 23*a* and 23*b* are connected in series between the output leads 17*a* and 17*b* from output amplifiers 16*a* and 16*b*. Resistors 23*a* and 23*b* are preferably of substantially equal value and are of substantially higher impedance than primary coil 18 of output transformer 19 in order not to excessively draw down the output of the filter circuit. A lead 24 connects the center of the resistor combination to the input of a variable gain feedback amplifier 25, the output of which is connected to drive coils 13*a* and 13*b*. In this manner, the sum of the output signals from amplifiers 16*a* and 16*b* is fed back to drive coils 13*a* and 13*b* of the tuning forks 12*a* and 12*b*.

The variable gain feedback amplifier 25 may be of a conventional type such as, for example, a transistor amplifier having a variable resistor 26 connected between its emitter and ground. The output from amplifier 25 is combined with the output of input amplifier 14, and the combined signals operate the drive coils 13*a* and 13*b* of the tuning forks 12*a* and 12*b*.

It should be noted that the feedback through lead 24 and feedback amplifier 25 to drive coils 13*a* and 13*b* is in the negative sense. In other words, when the input signal from input amplifier 14 is increasing, the feedback signal from feedback amplifier 25 will be decreasing, and, conversely, when the input signal from input amplifier 14 is decreasing, the feedback signal from amplifier 25 will be increasing.

Figure 2:
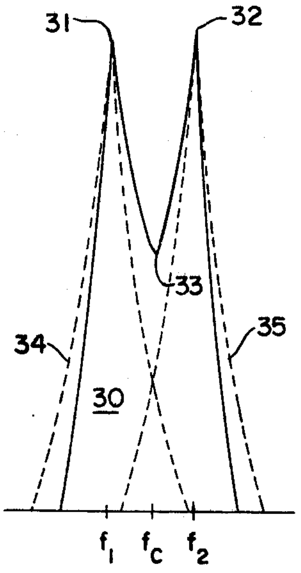
FIG. 2 is a graph of the amplitude response characteristic of the filter of FIG. 1 without feedback.

Referring now to FIG. 2 of the drawings, there is shown a graph of the frequency response characteristic of the filter circuit 10 of FIG. 1 measured at the secondary 20 of output transformer 19 when the gain of the feedback loop is zero. The ordinate of the graph is the magnitude of the output signal from the secondary winding 20 of output transformer 19, and the abscissa of the graph is frequency. As shown in FIG. 1, the frequency response characteristic 30 has two peaks 31 and 32, which correspond to the resonant frequencies $f_1$ and $f_2$, respectively, of the two tuning forks 12*a* and 12*b* shown in the filter circuit 10 of FIG. 1. There is a dip 33 at approximately the center frequency $f_c$ of the filter circuit 10. Graphs 34 and 35 of the frequency response characteristics of the individual tuning fork resonators measured at the outputs of amplifiers 16*a* and 16*b* are shown in dotted form.

Assuming that no feedback is employed, the depth of the dip 33 depends upon the bandwidth of the individual frequency response characteristic of the two tuning forks 12*a* and 12*b* and the difference between their resonant frequencies $f_1$ and $f_2$. For example, if the difference between the resonant frequencies $f_1$ and $f_2$ of the two tuning forks 12*a* and 12*b* are approximately equal to the bandwidth of an individual tuning fork, there will be no dip 33, but there will be instead a Butterworth or "flat-topped" frequency response characteristic as is described in the patent to Shreve, supra.

On the other hand, if the difference between the resonant frequencies $f_1$ and $f_2$ of the two tuning forks is greater than the bandwidth of an individual tuning fork, there will be a dip 33 in the frequency response characteristic. If the difference between the resonant frequencies of the two tuning forks is sufficiently large in relation to the bandwidth of an individual tuning fork response, the dip 33 in the frequency response characteristic of the combination will be so great as to severely limit the practical usefulness of the filter. For example, in FIG. 2, the difference between the resonant frequencies $f_1$ and $f_2$ of the two tuning forks is approximately five times the bandwidth of the response characteristic of an individual tuning fork. The result is that the dip 33 is about 9 db down from the peaks 31 and 32 of the response characteristic. Such a frequency response characteristic would not be useful for most practical purposes.

The present invention contemplates the use of negative feedback to modify the frequency response of the combined tuning forks so as to selectively produce a filter response characteristic resembling the well-known and useful Tchebycheff or Butterworth or Gaussian types of response.

Figure 3:
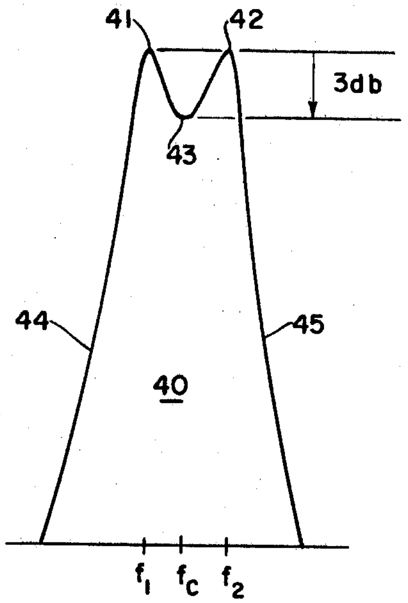
FIG. 3 is a graph of the amplitude response characteristic of the filter of FIG. 1 with sufficient negative feedback to produce a Tchebycheff response.

Referring now to FIG. 3 of the drawings, there is shown a graph 40 of the frequency response characteristic of the filter circuit 10 of FIG. 1 when sufficient negative feedback is used to give a Tchebycheff response. The graph 40 has a pair of peaks 41 and 42 at approximately the resonant frequencies $f_1$ and $f_2$, respectively, of the two tuning forks 12_a_ and 12_b_ of the filter circuit 10 of FIG. 1. There is a dip 43 at approximately the center frequency $f_c$ of the frequency response characteristic 40. As shown in FIG. 3, the dip 43 is approximately 3 db down in amplitude from the peaks 41 and 42 of the frequency response characteristic 40. Hence, the frequency response characteristic 40 shown in FIG. 3 resembles the well-known Tchebycheff or "equal ripple" frequency response characteristic which is useful in many filter applications.

The amount of feedback required to produce the Tchebycheff response characteristic will, in general, depend upon the bandwidths of the individual tuning fork resonators and upon the difference between their resonant frequencies $f_1$ and $f_2$. For example, if the difference between the resonant frequencies $f_1$ and $f_2$ is approximately five times the bandwidth of an individual tuning fork resonator as shown, for purposes of illustration, in FIG. 2, the amplitude of the signal fed back to the drive coils 13_a_ and 13_b_ by the feedback amplifier 25 would have to apply the equivalent of approximately 6 db of feedback at the resonant frequencies of the two tuning forks resonators. It will be appreciated, however, that this is but the roughest indication of the relationship between the feedback signal and the output signal. In reality, the relationship between these two signals is very complex with both the amplitude relationship and the phase relationship of the two signals varying as a functional of frequency. In general, however, it may be noted that the greater the difference between the resonant frequencies $f_1$ and $f_2$ of the tuning fork resonators in relation to the bandwidth of an individual resonator, the greater the amount of feedback that will have to be used in order to modify the frequency response characteristic so that it will resemble a Tchebycheff response characteristic.

Figure 4:
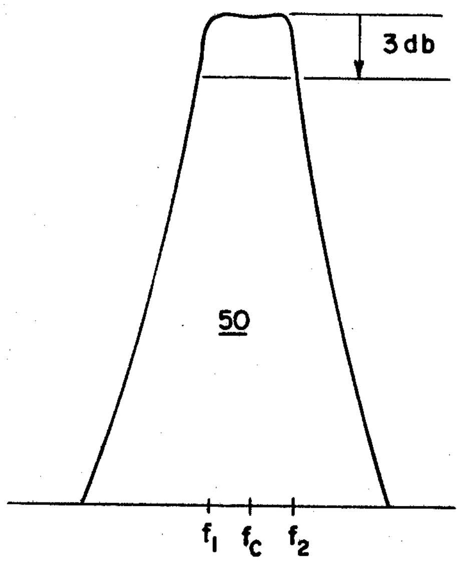
FIG. 4 is a graph of the amplitude response characteristic of the filter of FIG. 1 with sufficient feedback to produce a Butterworth response characteristic.

Referring now to FIG. 4 of the drawings, there is shown a graph of the frequency response characteristic 50 of the filter circuit 10 of FIG. 1 for the case in which sufficient feedback is employed to produce a Butterworth or "maximally flat" frequency response characteristic. The amount of feedback required to produce the Butterworth frequency response characteristic of FIG. 4 is approximately double that which would be required to produce the Tchebycheff response of FIG. 3. In either case, the precise amount of feedback required is determined heuristically by adjusting the gain of feedback amplifier 25, shown in FIG. 1, and measuring the frequency response of the filter circuit 10 at the secondary winding 20 of output transformer 19. As in the case of the Tchebycheff response shown in FIG. 3, the bandwidth (at 3 db down) of the Butterworth response shown in FIG. 4 is approximately six times the bandwidth of the frequency response of each individual tuning fork resonator.

Figure 5:
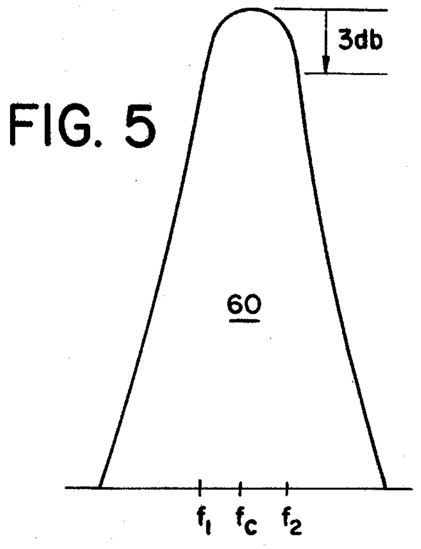
FIG. 5 is a graph of the amplitude response characteristic of the filter of FIG. 1 with sufficient feedback to produce a Gaussian response characteristic.

Referring now to FIG. 5 of the drawings, there is shown a graph of the frequency response characteristic 60 of the filter circuit 10 of FIG. 1 for the case in which sufficient feedback is employed to produce a Gaussian or "non-overshooting" frequency response characteristic. In order to produce the Gaussian frequency response characteristic of FIG. 5, slightly more feedback is used than would be required to produce the Butterworth response characteristic shown in FIG. 4. Once again, the precise amount of feedback would generally be determined heuristically by adjusting the gain of feedback amplifier 25 shown in FIG. 1 and measuring the frequency response at the secondary 20 of output transformer 19. As in the case of the Tchebycheff and Butterworth responses, the bandwidth of the Gaussian response is approximately six times the bandwidth of each individual tuning fork resonator.

Figure 6:
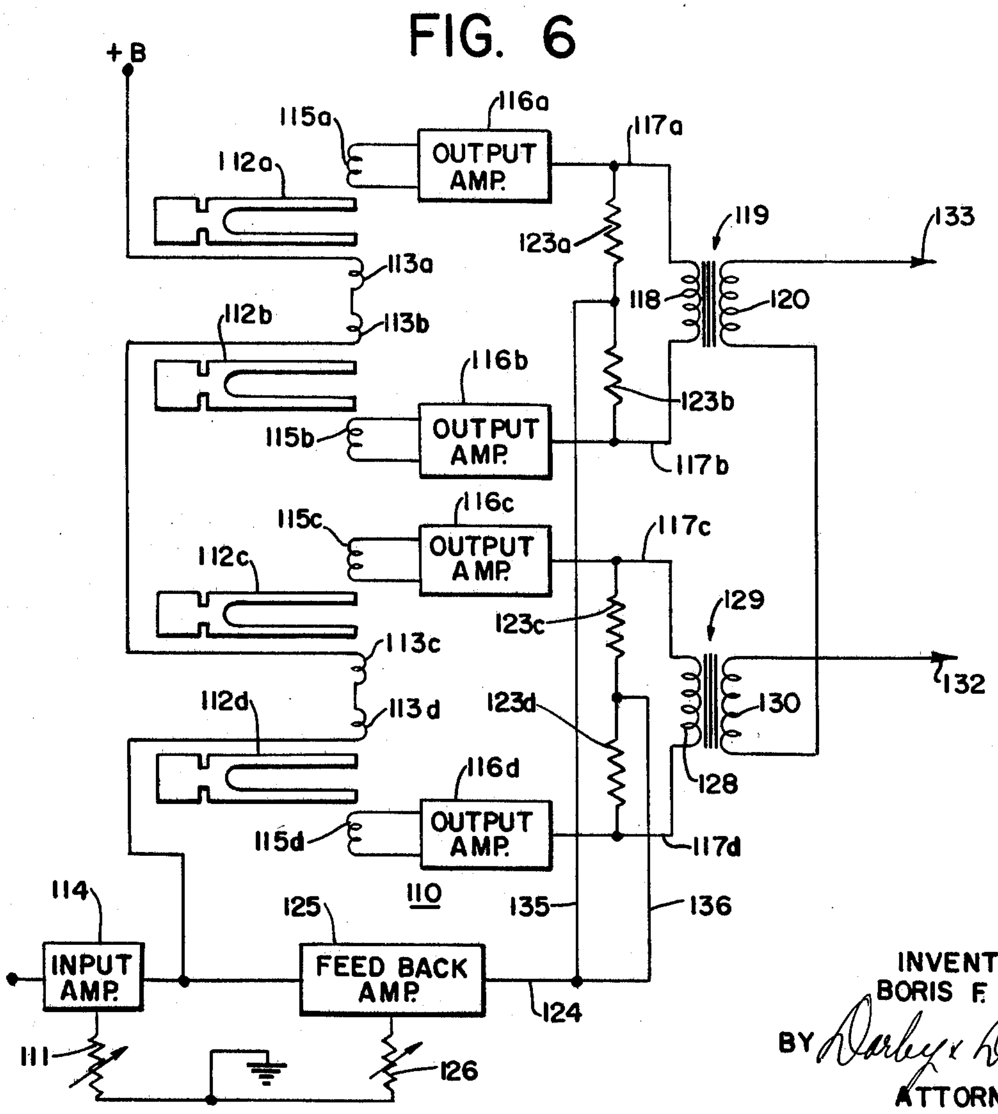
FIG. 6 is a schematic diagram of filter apparatus according to the present invention including four tuning forks having spaced-apart resonant frequencies.

Referring now to FIG. 6 of the drawings, there is shown a modified multiple tuning fork filter according to the present invention in which four tuning fork resonators 112_a_, 112_b_, 112_c_ and 112_d_, preferably having equally spaced resonant frequencies, are employed. The tuning forks 112_a–d_ are driven by drive coils 113_a–d_, respectively, which are in turn driven by a variable gain input amplifier 114. The drive coils 113_a–d_ may be, and preferably will be, provided with suitably arranged permanent magnet cores so that the forks will be driven at the same frequency as the input signal. Output signals are derived from the vibratory motion of the tuning forks 112_a–d_ by their associated pick-up coils 115_a–d_, and are amplified by output amplifiers 116_a–d_, respectively.

Although only a single drive coil and a single pick-up coil is associated with each tuning fork in the multiple tuning fork filter circuit 110 of FIG. 6, it will be appreciated that other driving and pick-up arrangements such as, for example, balanced pairs of coils, may be employed.

The output signals from amplifiers 116_a_ and 116_b_ are applied via leads 117_a_ and 117_b_ to the opposite ends of the primary winding 118 of output transformer 119 with the result that the signal coupled over to secondary winding 120 will be proportional to the difference between the output signals from amplifiers 116_a_ and 116_b_. This subtractive relationship results in the rejection of unwanted signals as explained in greater detail hereinabove.

Similarly, the output signals from amplifiers 116_c_ and 116_d_ are applied via leads 117_c_ and 117_d_ to the ends of the primary winding 128 of output transformer 129 with the result that the signal coupled over to secondary winding 130 will be proportional to the difference between the output signals from amplifiers 116_c_ and 116_d_. Secondary windings 120 and 130 are interconnected so that the ultimate filter output signal appearing across leads 132 and 133 is equal to the difference of the individual output signals appearing across secondary windings 120 and 130.

A pair of resistors 123_a_ and 123_b_, preferably of equal value, are connected in series across the leads 117_a_ and 117_b_, and a signal, proportional to the sum of the output signals from amplifiers 116_a_ and 116_b_ is tapped from the center of the combination of resistors 123_a_ and 123_b_ by lead 135. Similarly, a pair of resistors 123_c_ and 123_d_ preferably equal in value, are connected in series across leads 117_c_ and 117_d_, and a signal proportional to the sum of the output of amplifiers 116_c_ and 116_d_ is tapped from the center of the resistor combination by lead 136. Leads 135 and 136 are connected to lead 124 which therefore carries a signal proportional to the sum of all of the output signals from amplifiers 116_a–d_. This signal is fed into variable gain feedback amplifier 125.

The output signal from feedback amplifier 125 is combined with the signal from input amplifier 114 to complete the negative feedback loop. The operation of the negative feedback loop is such that when the signal from input amplifier 114 is increasing, the feedback signal from feedback amplifier 125 will be decreasing, and, conversely, when the signal from input amplifier 114 is decreasing, the signal from feedback amplifier 125 is increasing.

Figure 7:
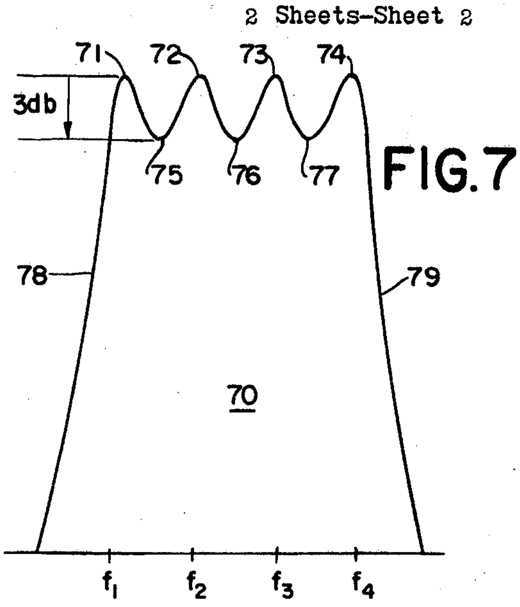
FIG. 7 is a graph of the amplitude response characteristic of the filter of FIG. 6 with sufficient feedback to produce a Tchebycheff response characteristic.

Referring now to FIG. 7 of the drawings, there is shown a graph of the frequency response characteristic 70 of the filter circuit 110 shown in FIG. 6 when sufficient feedback is employed to produce a Tchebycheff or "equal ripple" response. The difference in frequency between the adjacent peaks 71, 72, 73 and 74 is approximately six times the bandwidth of an individual tuning fork resonator. The dips 75, 76 and 77 are approximately 3 db down from the peaks 71–74 so that the filter response 70 resembles the well-known Tchebycheff response. As in the case of the dual tuning fork filter 10 shown in FIG. 1, the gain of feedback amplifier 125 of the multiple tuning fork filter 110 of FIG. 6 may be increased to produce a Butterworth or a Gaussian frequency response characteristic.

While the tuning forks of the filter circuits 10 and 110 shown respectively in FIGS. 1 and 6 are preferably driven in unison and the output signals from the tuning forks are subtracted from each other to provide a filter output signal, it will be appreciated by those skilled in the art that the proper phase relationship can be obtained by driving the tuning forks in phase opposition and adding their output signals to provide the filter output signal. The feedback signal would, in that case, be derived from the difference of the tuning fork output signals.

From the foregoing explanation it will be seen that the present invention provides a multiple tuning fork resonator employing common feedback to selectively provide the desired frequency response characteristic. Several modifications and adaptations of the multiple tuning fork filter having been described for the purpose of illustrating the principles of the invention, and it will be appreciated that other and different modifications and adaptations of the present multiple tuning fork filter may be made without departing from the spirit and scope of the invention.

What is claimed is:

1. Tuning fork filter apparatus for electrical signals comprising a pair of tuning forks having different resonant frequencies, a drive coil for each of said tuning forks, means for applying a common drive signal to said drive coils so as to drive said tuning forks in a first predetermined phase relation, a pick-up coil for each of said tuning forks, first circuit means for combining the signals from said pick-up coils in substantially said first predetermined phase relation so as to provide a feedback signal proportional to the first combined signals from said pick-up coils, second circuit means for combining the signals from said pick-up coils in a second predetermined phase relation so as to provide a filter output signal proportional to the second combined signals from said pick-up coils, and third circuit means for combining said feedback signal in the negative sense with the filter input signal to provide said common drive signal for said drive coils.

2. The tuning fork filter of claim 1, wherein the difference between the resonant frequencies of the two tuning forks is substantially greater than the bandwidth of the frequency response characteristic of either one of said tuning forks.

3. The tuning fork filter apparatus of claim 2, wherein said second predetermined phase relation differs by substantially 180° from said first predetermined phase relation.

4. The tuning fork filter of claim 3, wherein said second circuit means comprises a transformer having a primary winding and a secondary winding, said signals from said pick-up coils being applied to opposite ends of said primary winding so as to provide at said secondary winding a filter output signal proportional to the difference between said signals from said pick-up coils.

5. The tuning fork filter of claim 3, wherein said first circuit means comprises a voltage divider connected between said pick-up coils, said feedback signal being tapped from the center of said voltage divider.

6. The tuning fork filter of claim 3, wherein the strength of said feedback signal is sufficient to produce an amplitude dip within the passband of the filter frequency response corresponding to 3 decibels.

7. The tuning fork filter of claim 3, wherein the strength of said feedback signal is sufficient to produce a substantially flat-topped frequency-amplitude filter response.

8. The tuning fork filter of claim 3, wherein the strength of said feedback signal is sufficient to produce a Gaussian-type frequency-amplitude filter response.

9. Filter apparatus for electrical signals comprising a pair of resonant means having different resonant frequencies, means for applying a common drive signal to said resonant means, first circuit means for combining the output signals from said resonant means in a first phase relationship to provide a filter output signal, second circuit means for combining the output signals from said resonant means in a second phase relationship different from said first phase relationship to provide a feedback signal, and third circuit means for combining said feedback signal and the filter input signal to provide said common drive signal for said resonant means.

10. The filter apparatus of claim 9, wherein said first circuit means combines the output signals from said resonant means in a mutually subtractive relation.

11. The filter apparatus of claim 10, wherein said second circuit means combines the output signals from said resonant means in a mutually additive relation.

12. The filter apparatus of claim 11, wherein said third circuit means combines said feedback signal in the negative sense with said filter input signal.

13. Filter apparatus for electrical signals comprising a plurality of resonant circuits having different resonant frequencies, means for applying a common drive signal to said resonant means, first circuit means for combining the output signals from said resonant means in a first phase relationship to provide a filter output signal, second circuit means for combining the output signals from said resonant means in a second phase relationship to provide a feedback signal, and means for combining said feedback signal and the filter input signal to provide said common drive signal for said resonant means.

14. The filter apparatus of claim 13, wherein said first circuit means combines the output signals from resonant circuits having adjacent resonant frequencies in a mutually subtractive relation.

15. The filter apparatus of claim 14, wherein said second circuit means combines the output signals from said resonant means in a mutually additive relation.

16. The filter apparatus of claim 15, wherein said third circuit means combines said feedback signal in the negative sense with said filter input signal.

17. Tuning fork filter apparatus for electrical signals comprising a plurality of pairs of tuning forks having different resonant frequencies, a drive coil for each of said tuning forks, means for applying a common drive signal to said drive coils, a pick-up coil for each of said tuning forks, first circuit means associated with each pair of tuning forks for combining the signals from the pick-up coils of said tuning forks in a mutually subtractive relation, second circuit means associated with each pair of tuning forks for combining the signals from the pick-up coils of said tuning forks in a mutually additive relation to provide feedback signals, third circuit means for combining said feedback signals in the negative sense with the filter input signal to provide said common drive signal, and output circuit means for combining the signals from said first circuit means to provide a filter output signal.

18. The tuning fork filter apparatus of claim 17, wherein the resonant frequencies of said tuning forks are approximately equally spaced and wherein the difference between adjacent resonant frequencies is greater than the bandwidth of either tuning fork.

19. The tuning fork filter of claim 18, wherein said third circuit means includes a variable gain amplifier.

References Cited

UNITED STATES PATENTS 2,478,330 8/1949 Shonnard ---------- 331—156

FOREIGN PATENTS 509,235 7/1939 Great Britain.

ROY LAKE, Primary Examiner

J. B. MULLINS, Assistant Examiner

U.S. Cl. X.R.

330—174; 333—71